United States Patent
Aramaki et al.

(10) Patent No.: US 12,482,638 B2
(45) Date of Patent: Nov. 25, 2025

(54) SUBSTRATE PROCESSING APPARATUS AND SHUTTER

(71) Applicant: Tokyo Electron Limited, Tokyo (JP)

(72) Inventors: Takashi Aramaki, Miyagi (JP); Kojiro Matsuzaka, Miyagi (JP); Atsushi Ogata, Miyagi (JP); Lifu Li, Miyagi (JP); Gyeong Min Park, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 58 days.

(21) Appl. No.: 18/381,222

(22) Filed: Oct. 18, 2023

(65) Prior Publication Data

US 2024/0128058 A1 Apr. 18, 2024

(30) Foreign Application Priority Data

Oct. 18, 2022 (JP) .................................. 2022-167131
Sep. 22, 2023 (JP) .................................. 2023-157473

(51) Int. Cl.
 *H01J 37/32* (2006.01)
(52) U.S. Cl.
 CPC ... *H01J 37/32513* (2013.01); *H01J 2237/334* (2013.01)

(58) Field of Classification Search
 CPC ..................... H01J 37/32513; H01J 2237/334
 See application file for complete search history.

(56) References Cited

U.S. PATENT DOCUMENTS

2009/0283037 A1* 11/2009 Hardikar ........... H01L 21/67005
                                                              118/504
2018/0061619 A1*  3/2018 Matsuura .......... H01J 37/32577

FOREIGN PATENT DOCUMENTS

JP       2021-022652 A    2/2021
KR       2018-0025832 A   3/2018

* cited by examiner

*Primary Examiner* — Yuechuan Yu
(74) *Attorney, Agent, or Firm* — XSENSUS LLP

(57) ABSTRACT

A substrate processing apparatus comprises a substrate support disposed in the chamber, a shutter including a valve body configured to open and close an opening of the chamber, and a baffle plate disposed between an inner peripheral side of the chamber and the substrate support and having a vertically inclined portion at an end portion on a substrate support side, and a contact member disposed on a side surface of the substrate support and formed of a conductive elastic member. In a state where the shutter is closed, contact between the end portion on the substrate support side and the contact member is maintained.

19 Claims, 14 Drawing Sheets

FIG. 9

| | CONDITION 1 | CONDITION 2 | CONDITION 3 | CONDITION 4 |
|---|---|---|---|---|
| REFERENCE EXAMPLE 4 | NON-EMISSION OF LIGHT | NON-EMISSION OF LIGHT | NON-EMISSION OF LIGHT | EMISSION OF LIGHT |
| REFERENCE EXAMPLE 1 | EMISSION OF LIGHT | EMISSION OF LIGHT | EMISSION OF LIGHT | EMISSION OF LIGHT |
| EXAMPLE | NON-EMISSION OF LIGHT | NON-EMISSION OF LIGHT | NON-EMISSION OF LIGHT | NON-EMISSION OF LIGHT |

SUBSTRATE PROCESSING APPARATUS AND SHUTTER

CROSS-REFERENCE TO RELATED APPLICATIONS

This application claims priority to Japanese Patent Application Nos. 2022-167131, filed on Oct. 18, 2022 and 2023-157473, filed on Sep. 22, 2023, the entire contents of each are incorporated herein by reference.

TECHNICAL FIELD

The present disclosure relates to a substrate processing apparatus and a shutter.

BACKGROUND

Conventionally, there is known a plasma processing apparatus for performing desired plasma processing on a wafer that is a substrate to be processed for semiconductor devices. The plasma processing apparatus includes, for example, a chamber accommodating a wafer. A placing table that places a wafer thereon and serving as a lower electrode, and an upper electrode facing the placing table are disposed in the chamber. The wafer is loaded into or unloaded from the chamber through an opening formed in the chamber by a transfer robot, for example. Further, in order to transfer in-chamber parts whose outer diameters are greater than that of the wafer through the opening of the chamber, there is suggested, e.g., a shutter mechanism having a valve body arranged along the entire inner circumference of the chamber while an opening of a chamber is enlarged (see Japanese Laid-open Patent Publication No. 2021-22652).

SUMMARY

The present disclosure provides a substrate processing apparatus and a shutter capable of suppressing plasma leakage.

A substrate processing apparatus according to one embodiment of the present disclosure comprises a cylindrical chamber, a substrate support disposed in the chamber, a shutter including a valve body configured to open and close an opening of the chamber, and a baffle plate disposed between an inner peripheral side of the chamber and the substrate support and having a vertically inclined portion at an end portion on a substrate support side, and a contact member disposed on a side surface of the substrate support and formed of a conductive elastic member, wherein in a state where the shutter is closed, contact between the end portion on the substrate support side and the contact member is maintained.

BRIEF DESCRIPTION OF THE DRAWINGS

FIG. 9 shows an example of test results of plasma leakage.

DETAILED DESCRIPTION

Hereinafter, embodiments of a substrate processing apparatus and a shutter of the present disclosure will be described in detail with reference to the accompanying drawings. The following embodiments are not intended to limit the present disclosure.

A baffle plate is disposed in a chamber to prevent plasma produced in the chamber from leaking into an exhaust system. When a valve body of a shutter is closed, an upper portion of the valve body is brought into contact with an upper surface of the chamber, and a lower portion of the valve body is brought into contact with a baffle plate, a deposition shield, or the like. In other words, the valve body is electrically connected (conducted) to the upper surface of the chamber, the baffle plate, or the like. However, when the valve body expands due to heat input by plasma processing, the upper portion of the valve body is in contact with the upper surface of the chamber, whereas the lower portion of the valve body is separated from the baffle plate, the deposition shield, or the like, which may result in plasma leakage. Therefore, it is expected to maintain electrical connection even if the valve body expands, and to suppress plasma leakage.

First Embodiment

<Configuration of Plasma Processing System>

Figure 1:
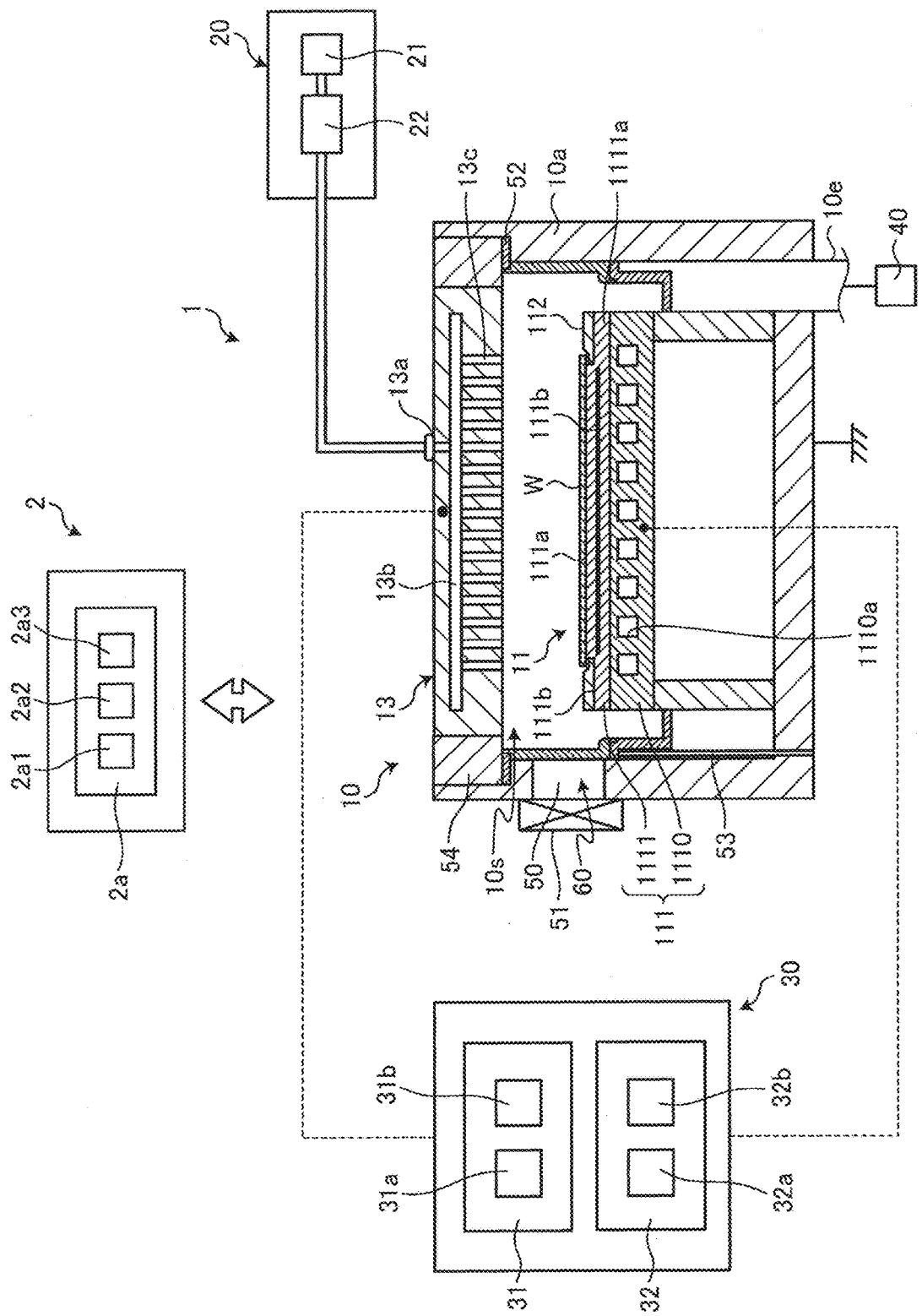
FIG. 1 shows an example of a plasma processing system according to a first embodiment of the present disclosure.

Hereinafter, a configuration example of a plasma processing system will be described. FIG. 1 shows an example of a plasma processing system according to a first embodiment of the present disclosure. As shown in FIG. 1, the plasma processing system includes a capacitively connected plasma processing apparatus 1 and a controller 2. The capacitively connected plasma processing apparatus 1 includes a plasma processing chamber 10, a gas supply part 20, a power supply part 30, and an exhaust system 40. Further, the plasma processing apparatus 1 includes a substrate support 11 and a gas introducing part. The gas introducing part is configured to introduce at least one processing gas into the plasma processing chamber 10. The gas introducing part includes a shower head 13. The substrate support 11 is disposed in plasma processing chamber 10. The shower head 13 is disposed above the substrate support 11. In one embodiment, the shower head 13 forms at least a part of a ceiling of plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas to the plasma processing space 10s, and at least one gas exhaust port for discharging a gas from the plasma processing space 10s. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 11a for supporting the substrate W and an annular region 111b for supporting the ring assembly 112. A wafer is an example of a substrate W. The annular region 111b of the main body 111 surrounds the central region 111a of the main body 111 in plan view. The substrate W is placed on the central region 111a of the main body 111, and the ring assembly 112 is placed on the annular region 111b of the main body 111 to surround the substrate W on the central region 111a of the main body 111. Therefore, the central region 111a is also referred to as a substrate supporting surface for supporting the substrate W, and the annular region 111b is also referred to as a ring supporting surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is placed on the base 1110. The electrostatic chuck 1111 includes a ceramic member 1111a and an electrostatic electrode 1111b embedded in the ceramic member 1111a. The ceramic member 1111a has the central region 111a. In one embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be placed on the annular electrostatic chuck or the annular insulation member, or may be placed on both the electrostatic chuck 1111 and the annular insulation member. Further, at least one RF/DC electrode connected to a radio frequency (RF) power supply 31 and/or a direct current (DC) power supply 32, which will be described later, may be embedded in the ceramic member 1111a. In this case, at least one RF/DC electrode functions as a lower electrode. When a bias RF signal and/or a DC signal, which will be described later, is supplied to at least one RF/DC electrode, the RF/DC electrode is also referred to as a bias electrode. The conductive member of the base 1110 and at least one RF/DC electrode may function as a plurality of lower electrodes. The electrostatic electrode 1111b may function as the lower electrode. Therefore, the substrate support 11 includes at least one lower electrode.

The ring assembly 112 includes one or more annular members. In one embodiment, one or more annular members include one or more edge rings and at least one cover ring. The edge ring is made of a conductive or an insulating material, and the cover ring is made of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a channel 1110a, or a combination thereof. A heat transfer fluid such as brine or A gas flows through the channel 1110a. In one embodiment, the channel 1110a is formed in the base 1110, and one or more heaters are embedded in the ceramic member 1111a of the electrostatic chuck 1111. Further, the substrate support 11 may include a heat transfer gas supply part configured to supply a heat transfer gas to the gap between the backside of the substrate W and the central region 111a.

The shower head 13 is configured to introduce at least one processing gas from the gas supply part 20 into the plasma processing space 10s. The shower head 13 has at least one gas supply port 13a, at least one gas diffusion space 13b, and a plurality of gas inlet ports 13c. The processing gas supplied to the gas supply port 13a passes through the gas diffusion space 13b and is introduced into the plasma processing space 10s from the gas inlet ports 13c. The shower head 13 may include, in addition to the shower head 13, one or multiple side gas injectors (SGI) attached to one or multiple openings formed in the sidewall 10a.

The gas supply part 20 may include at least one gas source 21 and at least one flow rate controller 22. In one embodiment, the gas supply part 20 is configured to supply at least one processing gas from a corresponding gas source 21 to the shower head 13 via a corresponding flow rate controller 22. The flow rate controllers 22 may include, for example, a mass flow controller or a pressure-controlled flow rate controller. Further, the gas supply part 20 may include one or more flow rate modulation devices for modulating the flow rate of at least one processing gas or causing it to pulsate.

The power supply part 30 includes an RF power supply 31 connected to the plasma processing chamber 10 via at least one impedance matching circuit. The RF power supply 31 is configured to supply at least one RF signal (RF power) to at least one lower electrode and/or at least one upper electrode. Accordingly, plasma is produced from at least one processing gas supplied to the plasma processing space 10s. Hence, the RF power supply 31 may function as at least a part of a plasma generator configured to generate a plasma from one or more processing gases in the plasma processing chamber 10. Further, by supplying a bias RF signal to at least one lower electrode, a bias potential is generated at the substrate W, and ion components in the generated plasma can be attracted to the substrate W.

In one embodiment, the RF power supply 31 includes a first RF generator 31a and a second RF generator 31b. The first RF generator 31a is connected to at least one lower electrode and/or at least one upper electrode via at least one impedance matching circuit, and is configured to generate a source RF signal (source RF power) for plasma generation. In one embodiment, the source RF signal has a frequency within a range of 10 MHz to 150 MHz. In one embodiment, the first RF generator 31a may be configured to generate multiple source RF signals having different frequencies. The generated one or multiple source RF signals are provided to at least one lower electrode and/or at least one upper electrode.

The second RF generator 31b is connected to at least one lower electrode via at least one impedance matching circuit, and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to 60 MHz. In one embodiment, the second RF generator 31b may be configured to generate multiple bias RF signals having different frequencies. The generated one or more bias RF signals are supplied to at least one lower electrode. Further, in various embodiments, at least one of the source RF signal and the bias RF signal may pulsate.

Further, the power supply part 30 may include a DC power supply 32 connected to the plasma processing chamber 10. The DC power supply 32 includes a first DC generator 32a and a second DC generator 32b. In one embodiment, the first DC generator 32a is connected to at least one lower electrode, and is configured to generate a first DC signal. The generated first bias DC signal is applied to at least one lower electrode. In one embodiment, the second DC generator 32b is connected to at least one upper electrode, and is configured to generate a second DC signal. The generated second DC signal is applied to at least one upper electrode.

In various embodiments, at least one of the first and second DC signals may pulsate. In this case, a sequence of voltage pulses is applied to at least one lower electrode and/or at least one upper electrode. The voltage pulse may have a rectangular pulse waveform, a trapezoidal pulse waveform, a triangular pulse waveform, or a combination thereof. In one embodiment, a waveform generator for generating a sequence of voltage pulses from a DC signal is connected between the first DC generator 32a and at least one lower electrode. Therefore, the first DC generator 32a and the waveform generator constitute a voltage pulse generator. When the second DC generator 32b and the waveform generator constitute a voltage pulse generator, the voltage pulse generator is connected to at least one upper electrode. The voltage pulse may have positive polarity or negative polarity. Further, the sequence of voltage pulses may include one or more positive voltage pulses and one or more negative voltage pulses in one cycle. The first and second DC generator 32a and 32b may be provided in addition to the RF power supply 31, or the first DC generator 32a may be provided instead of the second RF generator 31b.

The exhaust system 40 may be connected to a gas exhaust port 10e disposed at the bottom portion of the plasma processing chamber 10, for example. The exhaust system 40 may include a pressure control valve and a vacuum pump. The pressure in the plasma processing space 10s is adjusted by the pressure control valve. The vacuum pump may include a turbo molecular pump, a dry pump, or a combination thereof.

An opening 50 for loading and unloading the substrate W and a gate valve 51 for opening and closing the opening 50 are disposed at the sidewall 10a of the plasma processing chamber 10. In the plasma processing chamber 10, the deposition shield 52 is detachably disposed along the inner wall of the plasma processing chamber 10. An annular insulating member 54 made of, for example, alumina ($Al_2O_3$) or yttria ($Y_2O_3$) is airtightly disposed above the deposition shield 52. The deposition shield 52 is disposed above the opening 50 of the plasma processing chamber 10. The lower portion of the deposition shield 52 closes the opening 50 by the contact with the upper portion of the valve body 61 of the shutter 60, which will be described later. The deposition shield 52 may be formed by coating an aluminum base with ceramic such as $Y_2O_3$ or the like, for example. The lower portion of the deposition shield 52 is coated with a conductive material, such as stainless steel or nickel alloy, to be electrically connected to the valve body 61 in contact therewith. The deposition shield 52 is an example of a conductive upper member. The insulating member 54 insulates the shower head 13 and the deposition shield 52. In other words, the insulating member 54 insulates the shower head 13 from the sidewall 10a, the deposition shield 52, and the valve body 61 that are electrically connected to each other when the shutter 60 is closed. Further, at the lower portion of the shutter 60, an end portion 75 of a baffle plate 70, which will be described later, on the substrate support 11 side is slidably in contact with a sidewall of the main body 111.

The substrate W is loaded and unloaded by opening and closing the gate valve 51. Since, however, the gate valve 51 is disposed outside the plasma processing chamber 10 (on a transfer chamber side), a space in which the opening 50 projects toward the transfer chamber is formed. Therefore, the plasma produced in the plasma processing chamber 10 diffuses into the space, which results in deterioration of plasma uniformity or deterioration of a sealing member of the gate valve 51. Similarly, the plasma produced in the plasma processing chamber 10 diffuses to the space on the gas exhaust port 10e side, which results in deterioration of plasma uniformity. Hence, the plasma processing space 10s is blocked from the opening 50 and the gas exhaust port 10e of the plasma processing chamber 10 by blocking the deposition shield 52 and the sidewall of the main body 111 with the shutter 60. Further, a lifting mechanism 53 for driving the shutter 60 is disposed below the valve body 61, for example. The lifting mechanism 53 includes, for example, a rod connected to the valve body 61, and a driving part for vertically moving the rod using an air cylinder, a motor, or the like. The shutter 60 is vertically driven by the lifting mechanism 53 to open and close the opening 50. Further, it is preferable to provide a plurality of, e.g., three lifting mechanisms 53. The shutter 60 may include the lifting mechanism 53.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include a processing part 2a1, a storage part 2a2, and a communication interface 2a3. The controller 2 is realized by a computer 2a, for example. The processor 2a1 may be configured to read a program from the storage part 2a2 and perform various control operations by executing the read program. The program may be stored in the storage part 2a2 in advance, or may be acquired via a medium, if necessary. The acquired program is stored in the storage part 2a2, and is read out from the storage part 2a2 and executed by the processing part 2a1. The medium may be various storage media that can be read by the computer 2a, or may be a communication line connected to the communication interface 2a3. The processing part 2a1 may be a central processing unit (CPU). The storage part 2a2 includes a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

<Specific Description of Shutter 60>

Figure 2:
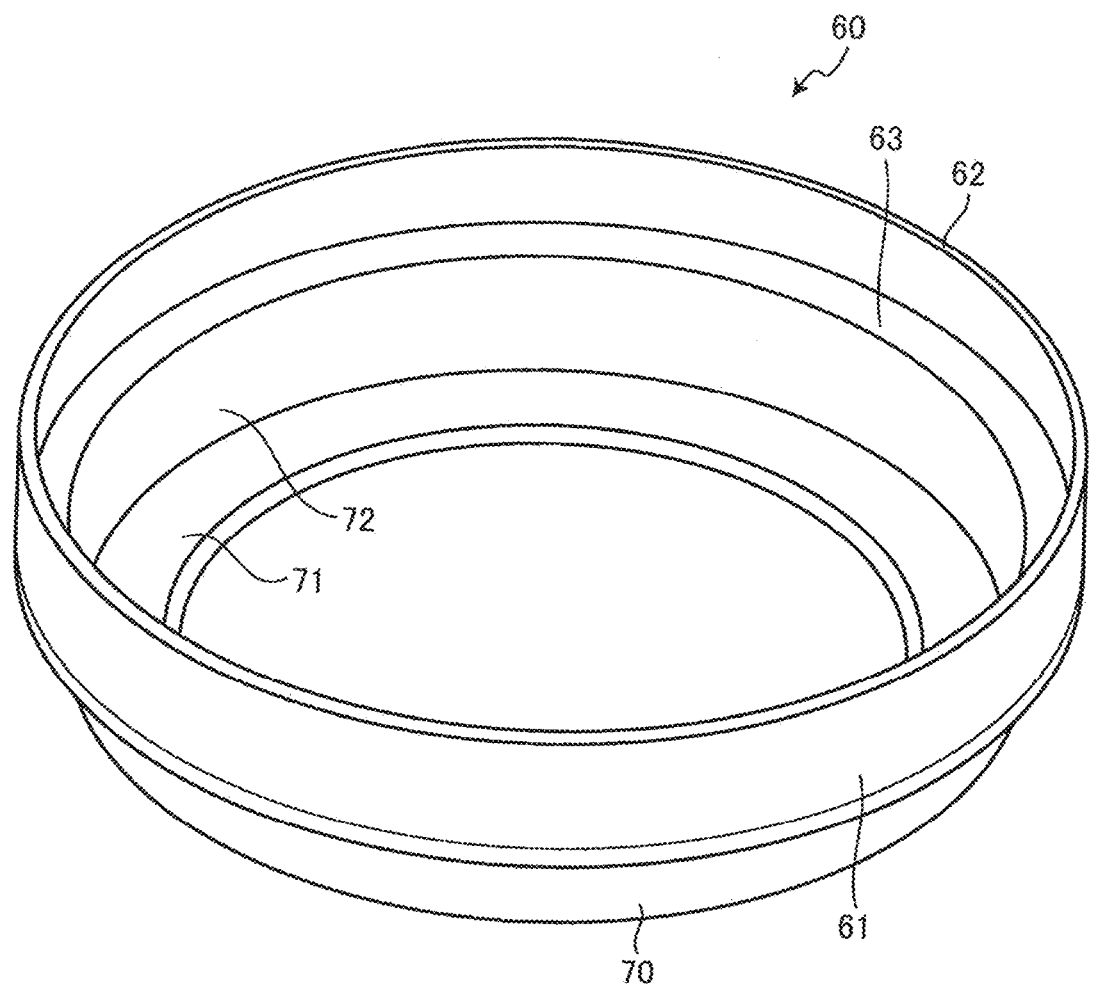
FIG. 2 is a perspective view showing an example of a shutter in the first embodiment.
Figure 3:
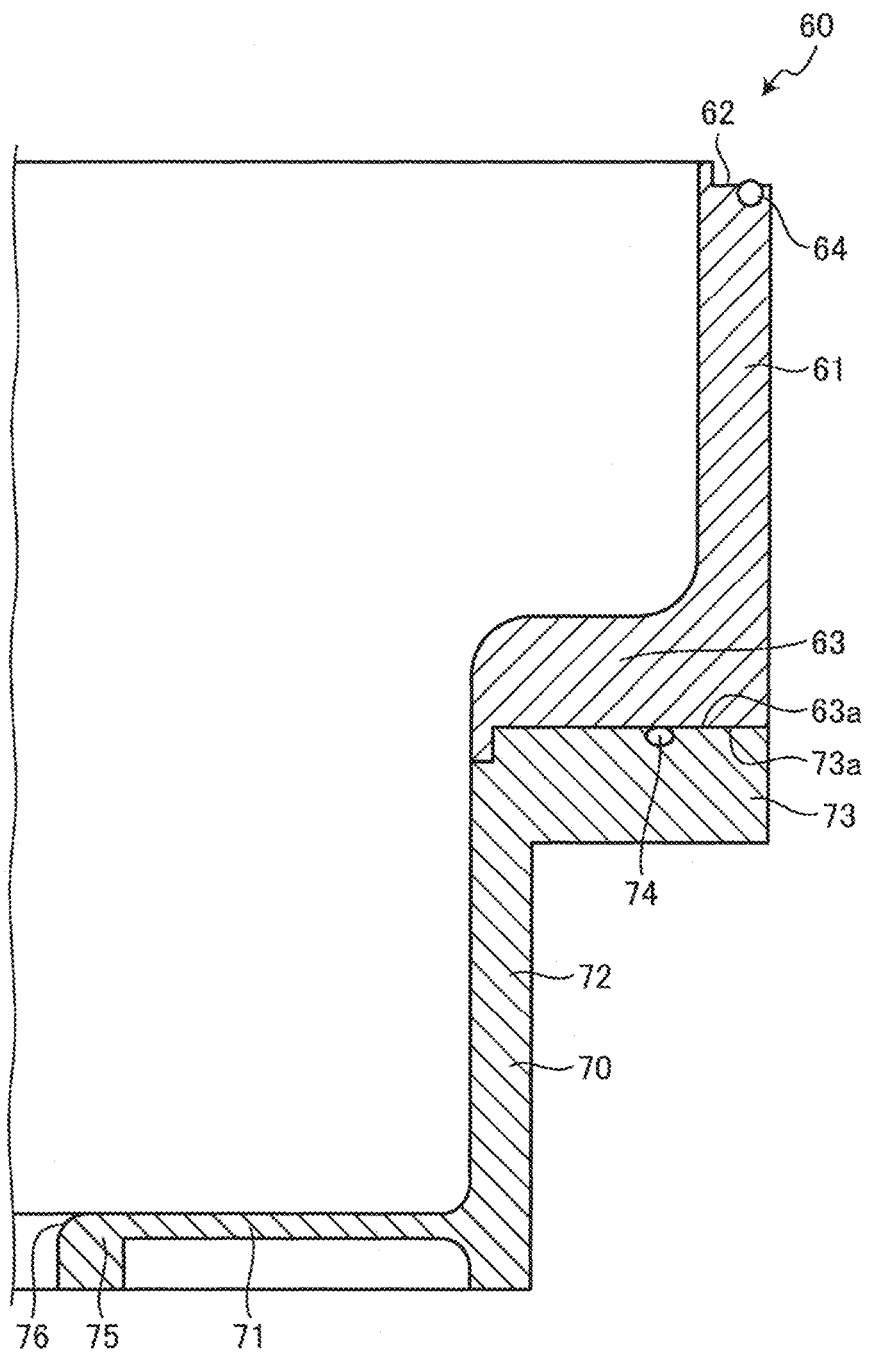
FIG. 3 is a partially enlarged view showing an example of a cross section of the shutter in the first embodiment.

FIG. 2 is a perspective view showing an example of a shutter in the first embodiment. FIG. 3 is a partially enlarged view showing an example of a cross section of the shutter in the first embodiment. As shown in FIGS. 2 and 3, the shutter 60 includes a valve body 61 and a baffle plate 70. The valve body 61 is a cylindrical valve body disposed along an inner circumference of the plasma processing chamber 10. The valve body 61 has an upper portion 62 that is brought into contact with the deposition shield 52 when the opening 50 is closed, and a bottom portion 63 connected to the baffle plate 70. Further, a conductive member 64 is disposed at the upper portion 62 to ensure electrical connection with the deposition shield 52. The conductive member 64, which is also referred to as a conductance band or a spiral, is a conductive elastic member. The conductive member 64 may be made of stainless steel or a nickel alloy, for example. The conductive member 64 is formed by winding a band-shaped member in a spiral shape, for example. Further, the conductive member 64 may be a diagonally wound coil spring having a U-shaped jacket, for example.

The baffle plate 70 has a flat portion 71, a cylindrical wall portion 72, and a flange portion 73. The flat portion 71 is an annular plate having a predetermined width and in contact with the sidewall of the main body 111 via a contact member 116 to be described later. The width of the flat portion 71 is an example of a first width. The flat portion 71 has a through-hole (not shown) to allow exhaust from the plasma processing space 10s. The wall portion 72 serves as a vertical surface (wall) on the outer circumferential side of the flat portion 71, and has an upper portion connected to the flange portion 73. The flange portion 73 is disposed in an annular shape on the wall portion 72, and is connected to the valve body 61. In other words, the flange portion 73 has an annular flat surface with a width that allows the valve body 61 to be placed on the flange portion 73. The width of the upper surface (flat surface) of the flange portion 73 is an example of a second width. In other words, the valve body 61 and the baffle plate 70 constitute the shutter 60. When the shutter 60 is opened or closed, the baffle plate 70 is vertically moved together with the valve body 61.

An upper surface 73a of the flange portion 73 is in contact with a bottom surface 63a of the bottom portion 63 of the valve body 61. A conductive member 74 for ensuring electrical connection between the valve body 61 and the baffle plate 70 is disposed between the upper surface 73a and the bottom surface 63a. The conductive member 74 is the same conductive elastic member as the conductive member 64. Further, a vertically inclined portion 76 in contact with the contact member 116 (to be described later) disposed at the sidewall of the main body 111 is formed on the inner circumferential side of the flat portion 71, that is, at the end portion 75 on the substrate support 11 side. The connecting portion between the upper portion of the inclined portion 76 and the upper surface of the flat portion 71 is formed as a curved surface without an edge.

Figure 4:
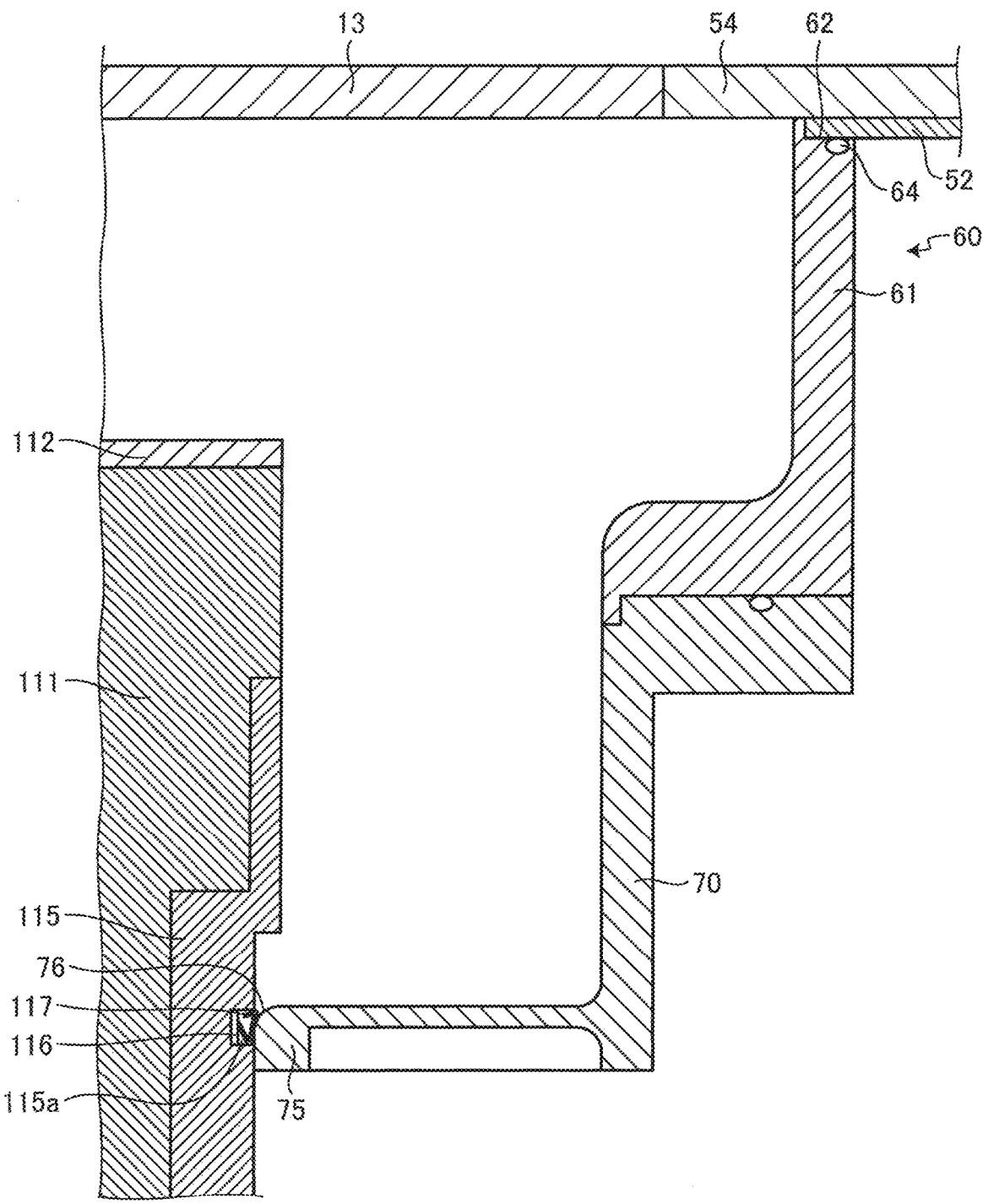
FIG. 4 is a partially enlarged view showing an example of a cross section in a state where the shutter is closed in the first embodiment.

Next, the contact state between the shutter 60 and the sidewall of the main body 111 in a state where the shutter is closed will be described with reference to FIG. 4. FIG. 4 is a partially enlarged view showing an example of a cross section in a state where the shutter is closed in the first embodiment. As shown in FIG. 4, the upper portion 62 of the valve body 61 of the shutter 60 is brought into contact with the deposition shield 52 disposed near the shower head 13 disposed at the upper portion of the plasma processing chamber 10, and the conductive member 64 is crushed. In this case, the electrical connection between the valve body 61 and the deposition shield 52 is ensured.

Further, a ring-shaped shield member 115 is disposed at the sidewall of the main body 111. The upper portion of the shield member 115 may extend to a position directly below the ring assembly 112. The shield member 115 protects the lower portion of the substrate support 11, such as the main body 111 or the like, from plasma. A thermally sprayed film such as $Y_2O_3$ or the like is formed on the surface of the shield member 115. Further, a groove 115a for the contact member 116 is formed in a circumferential direction in the shield member 115. A thermally sprayed film is not formed on the bottom portion of the groove 115a (the side surface of the main body 111), and the electrical connection is ensured by the contact between the shield member 115 and the contact member 116.

The contact member 116 is disposed in the groove 115a, and is formed as a conductive elastic member. The contact member 116 has spring portions 117 to be in contact with the inclined portion 76 of the end portion 75 of the baffle plate 70. In other words, the contact member 116 ensures electrical connection between the shield member 115 and the baffle plate 70. Further, the vertical length of the end portion is longer than that of the contact member 116. As described above, when the shutter 60 is closed, the electrical connection between the deposition shield 52, the valve body 61, the baffle plate 70, the contact member 116, and the shield member 115 is ensured.

Figure 5:
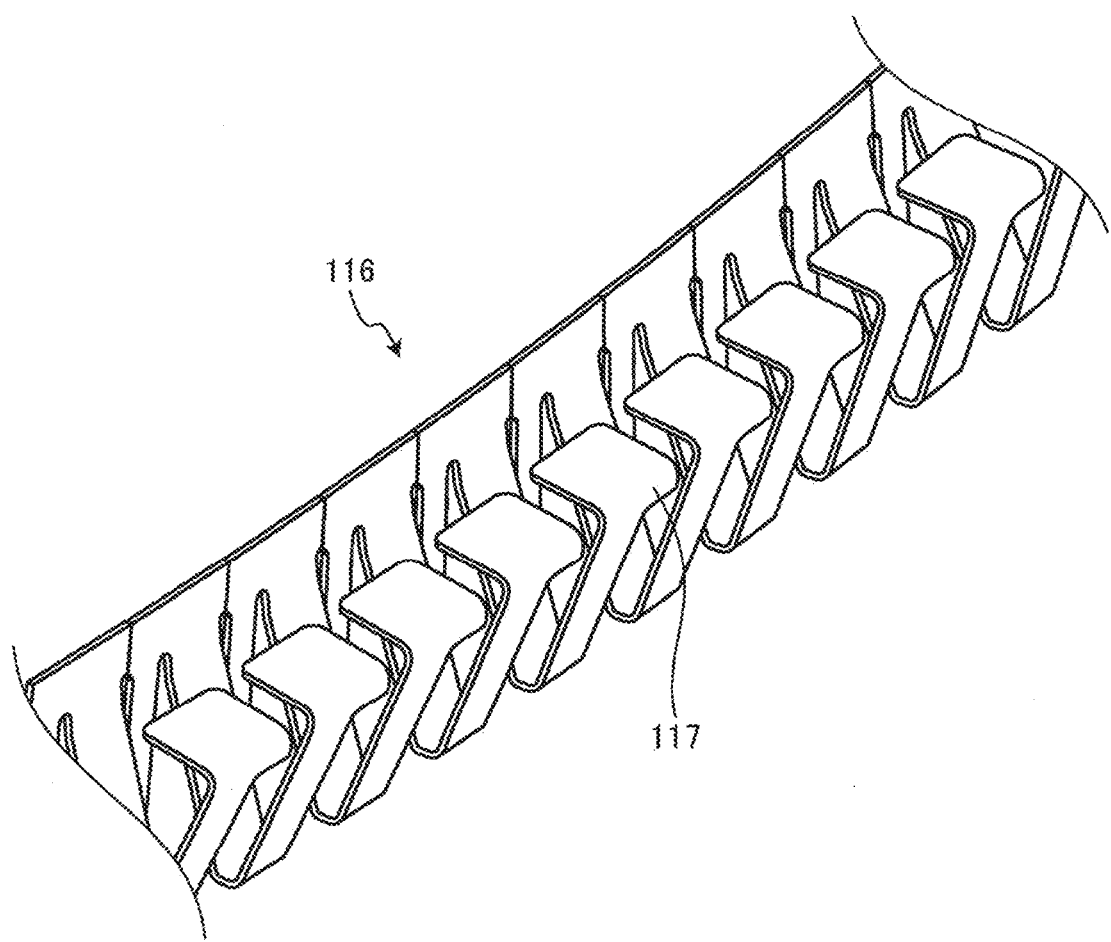
FIG. 5 is a perspective view showing an example of the contact member in the first embodiment.

FIG. 5 is a perspective view showing an example of the contact member in the first embodiment. As shown in FIG. 5, the contact member 116 is formed by connecting multiple spring portions 117 in the circumferential direction. When the shutter 60 is closed, the spring portions 117 are pressed toward the groove 115 along the inclined portion 76 of the end portion 75. In other words, in a state where the shutter 60 is closed, the contact between the contact member 116 and the end portion 75 of the baffle plate 70 on the substrate support 11 side is maintained.

Reference Example

Figure 6:
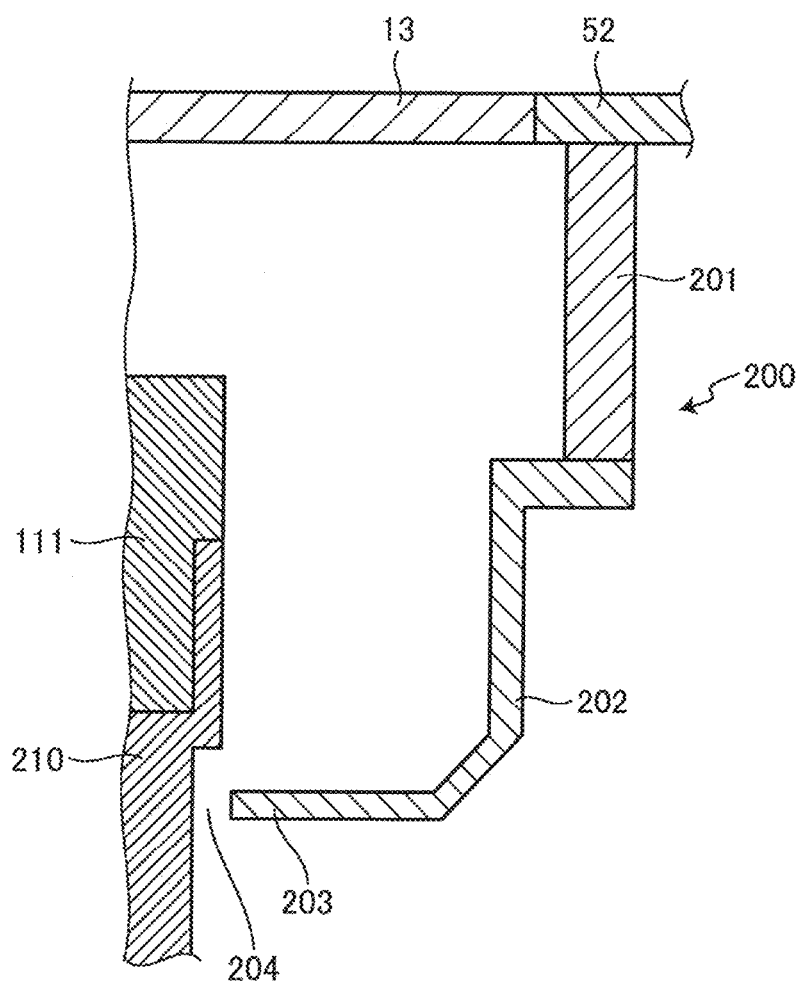
FIG. 6 shows an example of a cross section in a state where a shutter of Reference Example 1 is closed.
Figure 7:
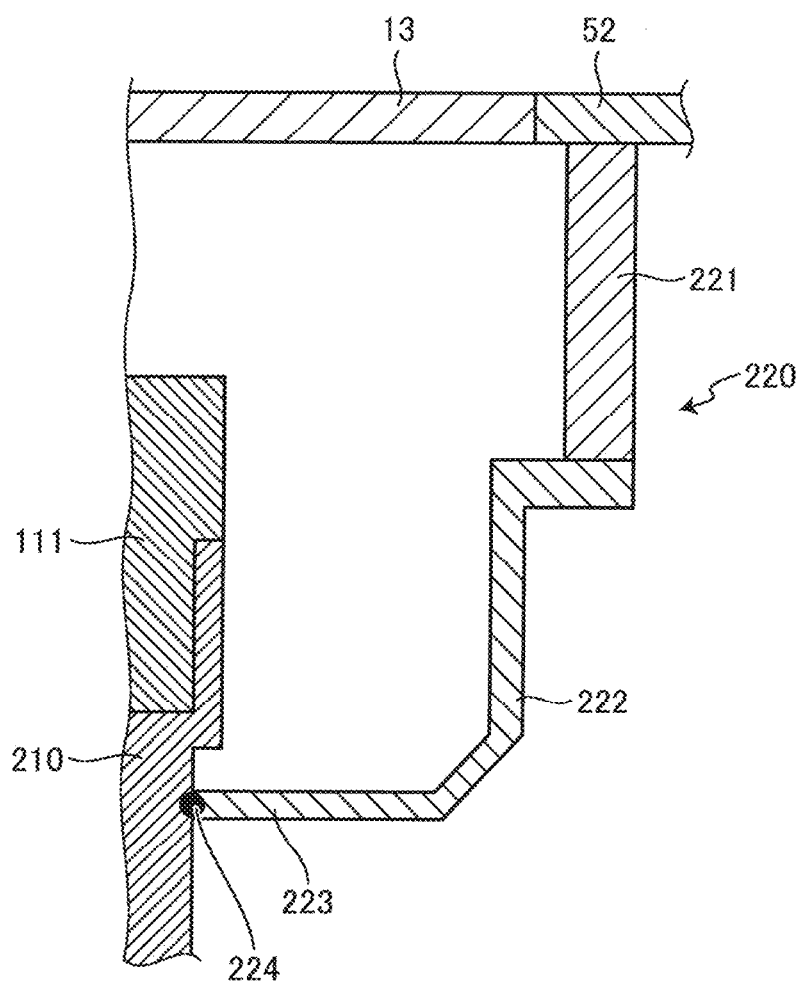
FIG. 7 shows an example of a cross section in a state where a shutter of Reference Example 2 is closed.
Figure 8:
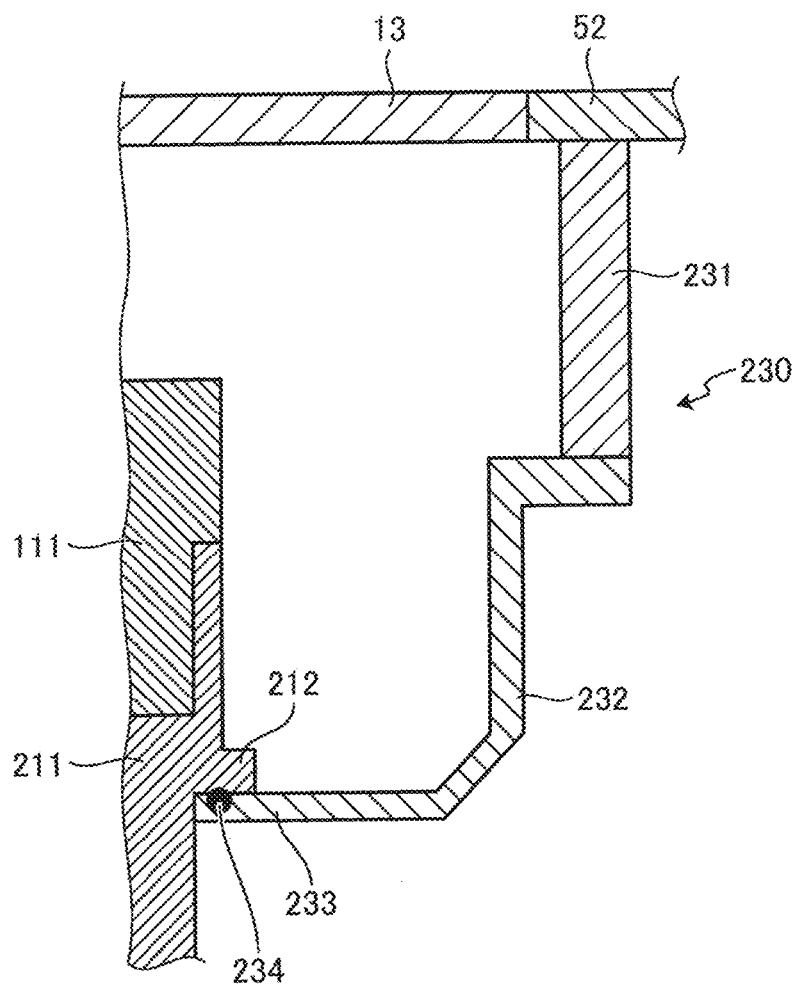
FIG. 8 shows an example of a cross section in a state where a shutter of Reference Example 3 is closed.

Next, Reference Examples 1 to 3 will be described with reference to FIGS. 6 to 8. FIG. 6 shows an example of a cross section in a state where the shutter of Reference Example 1 is closed. In FIGS. 6 to 8, specific parts of the individual components are omitted. A shutter 200 shown in FIG. 6 includes a valve body 201 and a baffle plate 202. Further, a ring-shaped shield member 210 is disposed on the sidewall of the main body 111. In Reference Example 1, the shutter 200 is closed, and the upper portion of the valve body 201 is in contact with the deposition shield 52 disposed near the shower head 13 disposed at the upper portion of the plasma processing chamber 10. On the other hand, a gap 204 exists between the shield member 210 and an end portion 203 of the baffle plate 202 on the main body 111 side. In other words, in Reference Example 1, the baffle plate 202 fixed to the shield member 210 is vertically movable together with the valve body 201. In this case, plasma leakage occurs because the baffle plate 202 and the shield member 210 are not electrically connected.

FIG. 7 shows an example of a cross section of Reference Example 2 in a state where the shutter is closed. The shutter 220 shown in FIG. 7 includes a valve body 221 and a baffle plate 222. Further, a ring-shaped shield member 210 is disposed on the sidewall of the main body 111, similarly to Reference Example 1. In Reference Example 2, the shutter 220 is in a closed state, and the upper portion of the valve body 221 is in contact with the deposition shield 52 disposed near the shower head 13 disposed at the upper portion of the plasma processing chamber 10. On the other hand, a conductive member 224 is disposed on the side surface of an end portion 223 of the baffle plate 222 on the main body 111 side, and is in contact with the shield member 210. In other words, in Reference Example 2, the electrical connection between the baffle plate 202 and the shield member 210 of Reference Example 1 is ensured by the conductive member 224. The conductive member 224 is the same conductive elastic member as the above-described conductive member 64. In this case, the conductive member 224 generates a reaction force against the crushing force. Thus, stress is applied to the baffle plate 222 in the radial direction, and the baffle plate 222 may be twisted and damaged. Further, when the shutter 220 is driven, the conductive member 224 in contact with the shield member 210 slides vertically, so that the conductive member 224 may be damaged. Even in the case where the conductive member 224 is disposed on the shield member 210 side, when the shutter 220 is driven, for example, the end portion 223 moves parallel to the wall of the shield member 210. Hence, the conductive member 224 may be damaged by a force applied in a direction different from a direction in which the conductive member 224 is crushed.

FIG. 8 shows an example of a cross section in a state where the shutter of Reference Example 3 is closed. The shutter 230 shown in FIG. 8 includes a valve body 231 and a baffle plate 232. Further, a ring-shaped shield member 211 is disposed on the sidewall of the main body 111. A flange portion 212 is disposed at the shield member 211 to be in contact with the upper surface of the end portion 233 of the baffle plate 232. In Reference Example 3, the shutter 230 is in a closed state, and the upper portion of the valve body 231 is in contact with the deposition shield 52 disposed near the shower head 13 disposed at the upper portion of the plasma processing chamber 10. On the other hand, a conductive member 234 is disposed on the upper surface of the end portion 233 of the baffle plate 232 on the main body 111 side. When the shutter 230 is closed, the conductive member 234 is crushed, thereby ensuring electrical connection between the flange portion 212 and the end portion 233. The conductive member 234 is the same conductive elastic member as the above-described conductive member 64. In other words, in Reference Example 3, the direction of contact between the baffle plate and the shield member is different from that in Reference Example 2. In this case, the baffle plate 232 and the shield member 211 are brought into contact with each other in the vertical direction. Therefore, when the shutter 230 is driven, stress is applied to the baffle plate 232 in the vertical direction, which may twist and damage the baffle plate 232. Further, when the shutter 230 thermally expands due to heat input by plasma, the flange portion 212 and the end portion 233 are separated, and the electrical connection may not be ensured.

<Test Results>

Next, test results on plasma leakage will be described with reference to FIG. 9. FIG. 9 shows an example of test results on plasma leakage. Table 90 shown in FIG. 9 shows emission/non-emission of light and occurrence/non-occurrence of plasma leakage in the case of performing plasma processing under conditions 1 to 4 in Reference Example 4, Reference Example 1, and Example of the present embodiment. The emission/non-emission of light is determined based on an image captured from a monitoring window near the gas outlet 10e of the plasma processing chamber 10. Here, Reference Example 4 shows a case of a conventional plasma processing apparatus in which a baffle plate is fixed to a shield member, a part of the sidewall of the plasma processing chamber is opened, and a shutter is provided to open and close the opening. Reference Example 1 shows a case of a plasma processing apparatus using the shutter 200 shown in FIG. 6. Condition 1 corresponds to a case where 2 kW is supplied as a source RF signal and 0 kV is supplied as a bias DC signal. Condition 2 corresponds to a case where 2 kW is supplied as a source RF signal and 4 kV is supplied as a bias DC signal. Condition 3 corresponds to a case where 0 kW is supplied as a source RF signal and 5 kV is supplied as a bias DC signal. Condition 4 corresponds to a case where 0 kW is supplied as a source RF signal and 6 kV is supplied as a bias DC signal. The supplied power increases in the order of Condition 1 to condition 4.

Under Conditions 1 to 3, in Reference Example 4 and Example, no light emission was observed (non-emission of light), and plasma leakage did not occur. On the other hand, in Reference Example 1, light emission was observed (emission of light), and plasma leakage occurred. Under Condition 4, no light emission was observed (non-emission of light) in Example, and plasma leakage did not occur. On the other hand, in Reference Example 4 and Reference Example 1, light emission was observed (emission of light), and plasma leakage occurred. In other words, the shutter 60 of the present embodiment can suppress plasma leakage more efficiently compared to the shutter in the conventional plasma processing apparatus of Reference Example 4.

As described above, in Example of the present embodiment, even if the valve body 61 and the baffle plate 70 expand due to heat input by plasma processing, the electrical connection between the end portion 75 and the contact member 116 is not disconnected, and plasma leakage can be suppressed. Further, the thermal expansion in the horizontal direction can also be absorbed by the spring portions 117, so that thermal stress applied to the shutter 60 can be reduced. Moreover, the contact stress in the driving direction of the shutter 60 can also be reduced.

<Variation of Contact Member>

Figure 10:
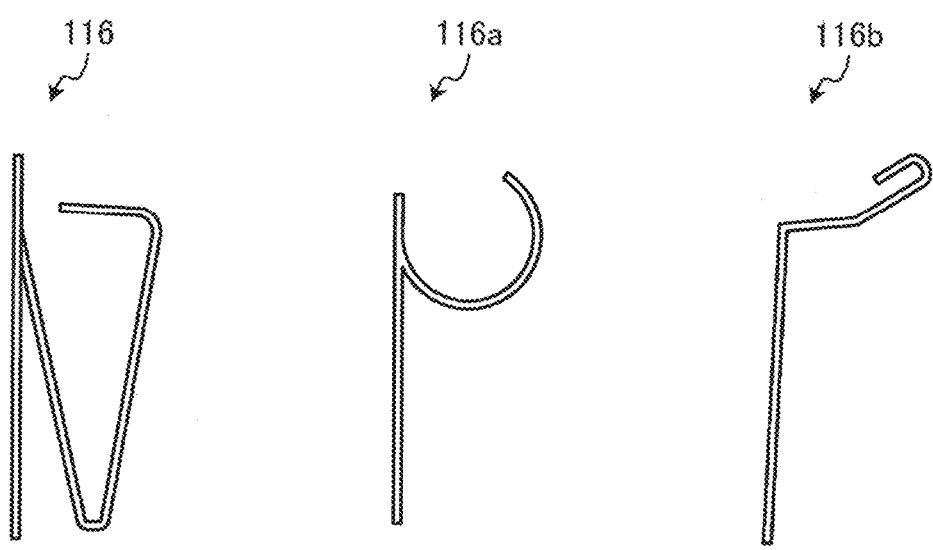
FIG. 10 shows variation of the contact member.

Next, the variation of the contact member 116 will be described with reference to FIG. 10. FIG. 10 shows variation of the contact member. As shown in FIG. 10, the contact member 116 corresponds to the contact member 116 of the above-described embodiment, and one spring portion 117 is representatively illustrated. In the example of FIG. 10, the cross section of the contact member 116 is illustrated.

The contact member 116a is variation of the contact member in which the spring portion has a circular shape. In the example of FIG. 10, the cross section of the contact member 116a is illustrated. The contact member 116b is variation of the contact member in which the spring portion has a U-shape. In the example of FIG. 10, the cross section of the contact member 116b is illustrated. Similarly to the contact member 116, the contact members 116a and 116b may be arranged continuously in the circumferential direction of the main body 111. Further, similarly to the contact member 116, the contact members 116a and 116b may suppress plasma leakage without disconnecting the electrical connection between the end portion 75 and the contact member 116. Further, the thermal expansion in the horizontal direction, or the contact stress in the driving direction of the shutter 60 can also be absorbed by the circular spring portions or the U-shaped spring portions, respectively.

Second Embodiment

In the first embodiment, the contact between the contact member 116 and the end portion 75 of the baffle plate 70 is maintained by the elasticity of the spring portions 117. However, the deformation of the spring portions 117 may be adjusted by a core material. Such an embodiment will be described as a second embodiment. Since the plasma processing apparatus of the second embodiment is the same as that of the above-described first embodiment except the core material of the contact member 116, the description of redundant configurations and operations will be omitted.

In the plasma processing performed by the plasma processing apparatus 1, a corrosive gas such as WF6 may be used as a processing gas, for example. In this case, the spring portions 117 of the contact member 116 may be plastically deformed by the corrosive gas after a long period of operation, so that the elasticity of the spring portions 117 may deteriorate, that is, the reaction force may decrease. Therefore, in the second embodiment, a case where the reaction force of the spring portions 117 is maintained by providing a core material in the deformation region of the spring portions 117 will be described.

Figure 11:
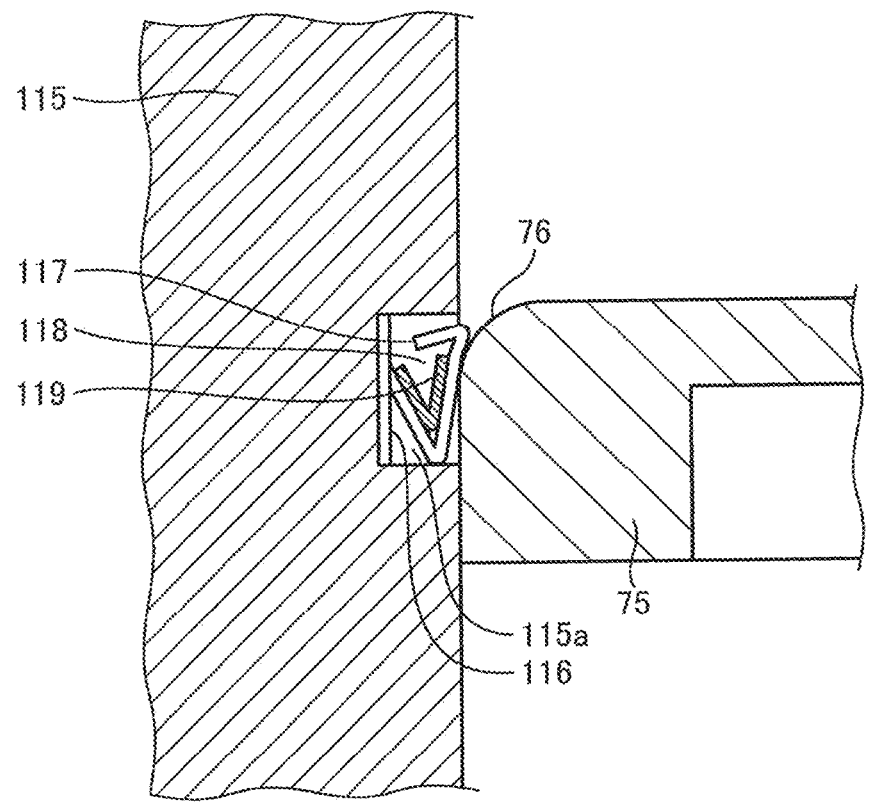
FIG. 11 is a partially enlarged view showing an example of a cross section near a contact member in a second embodiment.

FIG. 11 is a partially enlarged view showing an example of a cross section near the contact member in the second embodiment. As shown in FIG. 11, in the second embodiment, the contact member 116 is disposed in the groove 115a formed in the shield member 115, similarly to the first embodiment. The spring portion 117 of the contact member 116 is brought into contact with the inclined portion 76 of the end portion 75 of the baffle plate 70, and thus is pressed toward a deformation region 118 and elastically deformed. A core material 119 is disposed in the deformation region 118 of the contact member 116.

Figure 12:
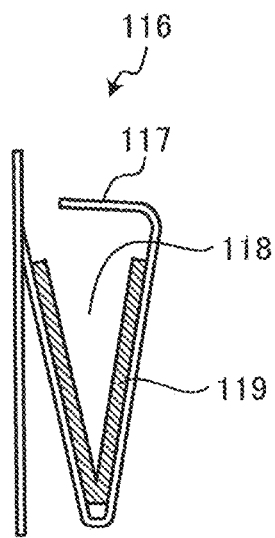
FIG. 12 shows an example of a core material of the contact member in the second embodiment.

FIG. 12 shows an example of the core material of the contact member in the second embodiment. As shown in FIG. 12, the core material 119 has a V-shaped cross section in the radial direction of the substrate support 11. The core material 119 is made of, for example, a material with high radical resistance such as perfluoroelastomer (FFKM) or the like. In other words, the core material 119 is formed of an elastic member such as fluororubber, for example. Further, the core material 119 may be formed of resin such as perfluoroalkoxyalkane (PFA), for example. The decrease in the reaction force of the core material 119 due to consumption and corrosion is less likely to occur compared to a metal material. When a force is applied from right and left sides to the upper portion of the V-shaped portion of the core material 119 in the corresponding cross section, the core material 119 is elastically deformed such that the V-shaped portion is closed, thereby adjusting the amount of elastic deformation of the spring portion 117. In other words, when the shutter 60 is opened and the end portion 75 of the baffle plate 70 and the contact member 116 are no longer in contact with each other, the core material 119 returns the spring portion 117 to its original shape, thereby maintaining the reaction force of the spring portion 117.

Figure 13:
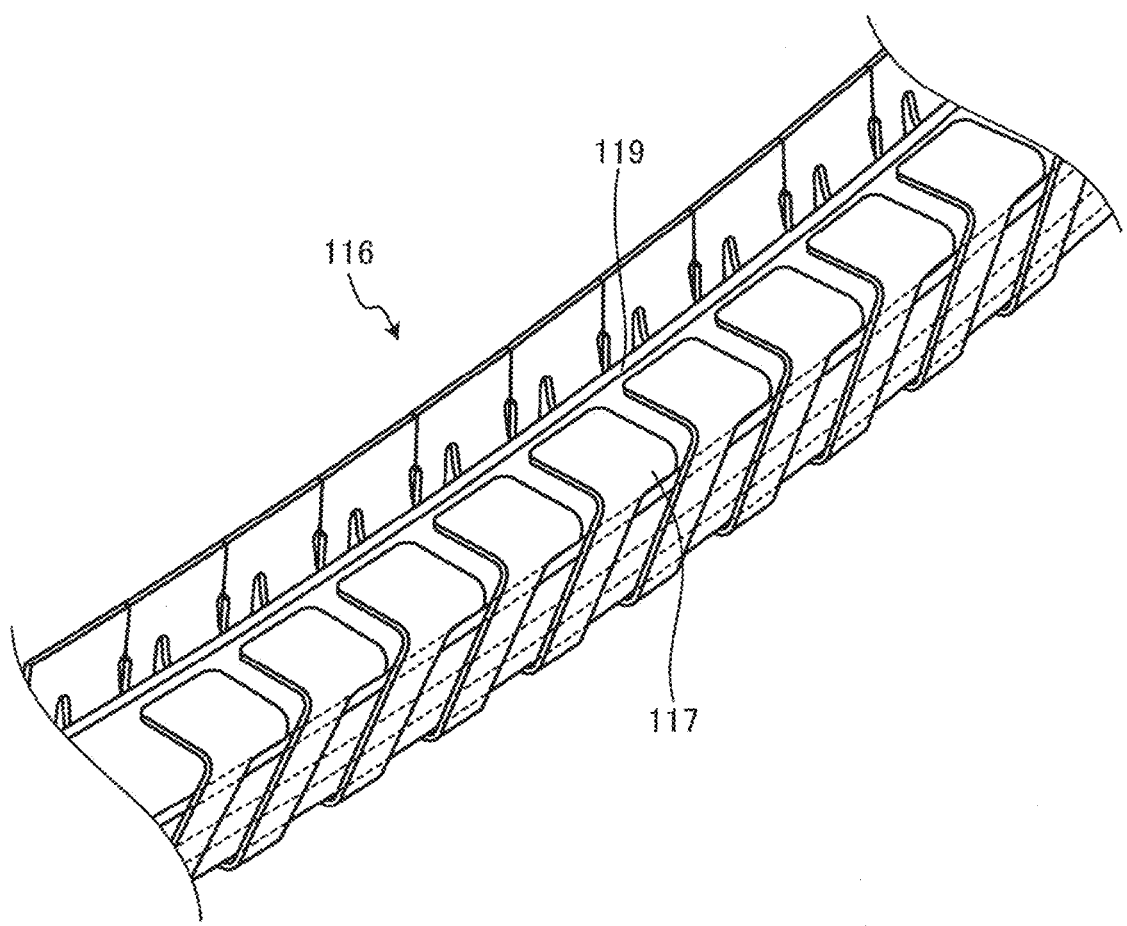
FIG. 13 is a perspective view showing an example of the contact member in the second embodiment.

FIG. 13 is a perspective view showing an example of a contact member in the second embodiment. As shown in FIG. 13, the contact member 116 is formed by connecting the plurality of spring portions 117 in the circumferential direction, and the core material 119 is disposed across the spring portions 117. In other words, by providing the core material 119 continuously in the circumferential direction, the gaps between the spring portions 117 can be filled, which makes it possible to further improve the shielding effect. In other words, in the second embodiment, by providing the core material 119, the reaction force of the spring portions 117 can be maintained, and the plasma leakage can be further suppressed. In other words, in the second embodiment, the plastic deformation of the spring portions 117 of the contact member 116 can be suppressed.

Figure 14:
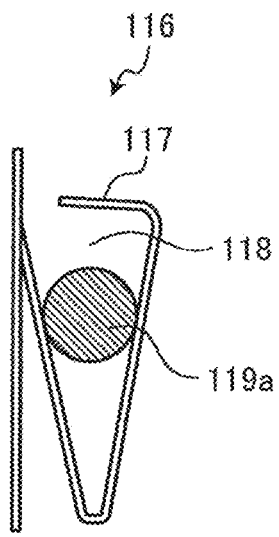
FIG. 14 shows another example of the core material of the contact member in the second embodiment.
Figure 15:
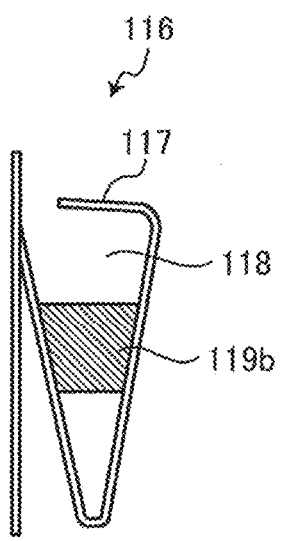
FIG. 15 shows another example of the core material of the contact member in the second embodiment.
Figure 16:
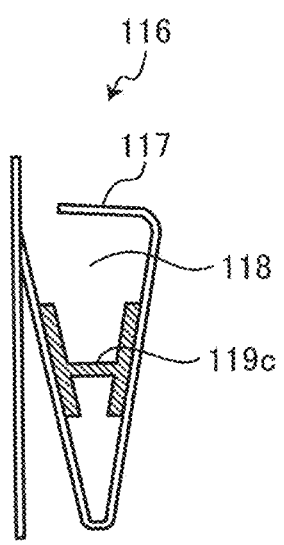
FIG. 16 shows another example of the core material of the contact member in the second embodiment.

Next, other cross-sectional shapes of the core material 119 will be described with reference to FIGS. 14 to 16. FIGS. 14 to 16 show other examples of the core material of the contact member in the second embodiment. A core material 119a shown in FIG. 14 is disposed in the deformation region 118 of the spring portion 117 in the contact member 116, and has a circular cross section in the radial direction of the substrate support 11. When a force is applied from right and left sides to the circular shape of the core material 119a in the corresponding cross section, the core material 119a is elastically deformed such that the circular shape is crushed, thereby adjusting the amount of elastic deformation of the spring portion 117. The core material 119a may have a hollow structure when it is made of resin such as PFA or the like, other than a solid structure.

The core material 119b shown in FIG. 15 is disposed in the deformation region 118 of the spring portion 117 in the contact member 116, and has a trapezoidal cross section in the radial direction of the substrate support 11. The core material 119b has a trapezoidal shape in which an upper side is longer than a lower side to correspond to the cross-sectional shape of the deformation region 118. When a force is applied from right and left side to the trapezoidal shape in the corresponding cross section, the core material 119b is elastically deformed such that the trapezoidal shape is crushed, thereby adjusting the amount of elastic deformation of the spring portion 117.

The core material 119c shown in FIG. 16 is disposed in the deformation region 118 of the spring portion 117 in the contact member 116, and has an H-shaped cross section in the radial direction of the substrate support 11. The core material 119c has a bridge-shaped cross section when it is separated from the contact member 116. The core material 119c is deformed such that the lower width of the H shape becomes narrow to correspond to the cross-sectional shape of the deformation region 118. In other words, the core material 119c has a shape that is likely to conform to the shape of the contact member 116. When a force is applied to the bridge shape (H shape) from right and left sides in the corresponding cross section, the core material 119c is elastically deformed such that the bridge portion (the horizontal portion at the center of the H shape) is crushed, thereby adjusting the amount of elastic deformation of the spring portion 117. The cross-sectional shapes of the core members 119 and 119a to 119c are not limited thereto as long as the core members 119 and 119a to 119c are elastic members capable of returning the spring portion 117 to its original shape.

As described above, the contact member 116 including the core material 119 of the second embodiment can maintain the reaction force of the spring portions 117, and can further enhance the shielding effect by filling the gaps between the spring portions 117. In other words, the contact member 116 including the core material 119 of the second embodiment can maintain the reaction force of the spring portions 117, and can further suppress plasma leakage. The contact member 116 may be made of, for example, stainless steel as a conductive elastic member, or may be made of a high corrosion-resistant metal (such as a nickel alloy or the like).

As described above, in accordance with the above-described embodiments, the substrate processing apparatus (the plasma processing apparatus 1) includes the chamber (the plasma processing chamber 10), the substrate support 11 disposed in the chamber, the shutter 60, and the contact member 116. The shutter 60 includes the valve body 61 configured to open and close the opening 50 of the cylindrical chamber, and the baffle plate 70 disposed between the inner peripheral side of the chamber and the substrate support 11 and having the vertical inclined portion 76 at the end portion 75 on the substrate support 11 side. The contact member 116 is disposed on the side surface of the substrate support 11, and is formed of a conductive elastic member. In the substrate processing apparatus, in a state where the shutter 60 is closed, the contact between the contact member 116 and the end portion 75 on the substrate support 11 side is maintained. Accordingly, plasma leakage can be suppressed.

Further, in accordance with the above-described embodiments, the shutter 60 has a cylindrical shape. Accordingly, in-chamber parts whose outer diameters are greater than that of the substrate W can be transferred through the opening 50 of the chamber.

Further, in accordance with the above-described embodiments, the end portion 75 on the substrate support 11 side has a vertical length longer than the vertical length of the contact member 116. Accordingly, even if the valve body 61 and the baffle plate 70 expand, the electrical connection (conduction) between the end portion 75 and the contact member 116 is not disconnected, and plasma leakage can be suppressed.

In accordance with the above-described embodiments, the inclined portion 76 has a shape in which the width of the baffle plate 70 becomes narrower from the bottom surface side toward the upper surface side of the baffle plate 70. Accordingly, when the shutter 60 is closed, the end portion 75 and the contact member 116 can be smoothly brought into contact with each other.

Further, in accordance with the above-described embodiments, the baffle plate 70 has the flat portion 71, the cylindrical wall portion 72, and the flange portion 73. The flat portion 71 has an annular flat surface having a first width, and has the end portion 75 on the substrate support 11 side on the inner circumferential side. The wall portion 72 serves as a vertical wall disposed on the outer circumferential side of the flat portion 71. The flange portion 73 has an annular flat surface with a second width on the wall portion 72. Accordingly, the plasma leakage can be suppressed.

Further, in accordance with the above-described embodiments, the bottom portion 63 of the valve body 61 is connected to the flange portion 73. Accordingly, the valve body 61 and the baffle plate 70 can be driven as one part.

Further, in accordance with the above-described embodiments, the valve body 61 is electrically connected to the baffle plate 70 with the conductive member 74 interposed between the bottom portion 63 and the flange portion 73. Accordingly, the valve body 61 and the baffle plate 70 may have the same potential.

Further, in accordance with the above-described embodiments, in the baffle plate 70, the connecting portion between the upper portion of the inclined portion 76 of the end portion 75 and the upper surface of the flat portion 71 are formed as a curved surface. Accordingly, when the shutter 60 is closed, the end portion 75 and the contact member 116 can be smoothly brought into contact with each other.

Further, in accordance with the above-described embodiments, the contact member 116 is disposed along the side surface of the substrate support 11. Accordingly, plasma leakage can be suppressed.

In accordance with the second embodiment, in the contact member 116, the core material (the core materials 119 and 119a to 119c) is disposed in the deformation region 118 of the elastic member (the spring portions 117). Accordingly, the reaction force of the spring portions 117 can be maintained, and plasma leakage can be further suppressed.

Further, in accordance with the second embodiment, the core material 119a has a circular cross section in the radial direction of the substrate support 11. Accordingly, the reaction force of the spring portions 117 can be maintained, and plasma leakage can be further suppressed.

In accordance with the second embodiment, the core material 119b has a trapezoidal cross section in the radial direction of the substrate support 11. Accordingly, the reaction force of the spring portions 117 can be maintained, and plasma leakage can be further suppressed.

In accordance with the second embodiment, the core material 119 has a V-shaped cross section in the radial direction of the substrate support 11. Accordingly, the reaction force of the spring portions 117 can be maintained, and plasma leakage can be further suppressed.

Further, in accordance with the second embodiment, the core material 119c has a bridge-shaped cross-section in the radial direction of the substrate support 11. Accordingly, the reaction force of the spring portions 117 can be maintained, and plasma leakage can be further suppressed.

Further, in accordance with the above-described embodiments, the valve body 61 includes the conductive member 64 on the conductive surface (the upper portion 62) formed at the upper end of the valve body 61 and in contact with the conductive upper member (the deposition shield 52) disposed along the upper inner wall of the chamber. When the opening 50 is closed by raising the valve body 61, the conductive surface is brought into contact with the upper member in the vertical direction, and the valve body 61 and the upper member are electrically connected by the conductive member. Accordingly, the shutter 60 and the plasma processing chamber 10 may have the same potential.

Further, in accordance with the above-described embodiments, the substrate processing apparatus includes the insulating member 54 that insulates the upper member and the shower head 13 disposed at the ceiling portion of the chamber. Accordingly, the short circuit between the upper member (the deposition shield 52) and the valve body 61 and the shower head 13 can be further suppressed.

It should be noted that the embodiments of the present disclosure are illustrative in all respects and are not restrictive. The above-described embodiments may be omitted, replaced, or changed in various forms without departing from the scope of the appended claims and the gist thereof.

Further, in the above-described embodiments, the case where the contact member 116 is formed by continuously connecting the spring portions 117 has been described. However, the present disclosure is not limited thereto. For example, in the contact member 116 shown in FIG. 5, the spring portions 117 may be arranged alternately.

Further, in the above-described embodiments, the upper portion of the end portion 75 of the baffle plate 70 is connected to the flat portion 71. However, the present disclosure is not limited thereto. For example, the lower portion of the end portion 75 may be connected to the bottom surface of the flat portion 71, that is, the end portion 75 may protrude upward from the flat portion 71.

Further, in the above-described embodiments, the plasma processing apparatus 1 that performs etching or the like on the substrate W using capacitively connected plasma as a plasma source has been described as an example. However, the present disclosure is not limited thereto. The plasma source is not limited to capacitively connected plasma as long as the apparatus processes the substrate W using plasma. For example, any plasma source such as inductively connected plasma, microwave plasma, magnetron plasma, or the like may be used.

Further, the present disclosure may employ the following configurations.

(1) A substrate processing apparatus comprising:
a cylindrical chamber;
a substrate support disposed in the chamber;
a shutter including a valve body configured to open and close an opening of the chamber, and a baffle plate disposed between an inner peripheral side of the chamber and the substrate support and having a vertically inclined portion at an end portion on a substrate support side; and
a contact member disposed on a side surface of the substrate support and formed of a conductive elastic member,
wherein in a state where the shutter is closed, contact between the end portion on the substrate support side and the contact member is maintained.

(2) The substrate processing apparatus of (1), wherein the shutter has a cylindrical shape.

(3) The substrate processing apparatus of (1) or (2), wherein the end portion on the substrate support side has a vertical length longer than a vertical length of the contact member.

(4) The substrate processing apparatus of any one of (1) to (3), wherein the inclined portion is formed such that a width of the baffle plate becomes narrower from a bottom surface side toward an upper surface side of the baffle plate.

(5) The substrate processing apparatus of any one of (1) to (4), wherein the baffle plate has:
a flat portion having an annular flat surface with a first width and having the end portion on the substrate support side on an inner circumferential side;
a cylindrical wall portion serving as a vertical surface on an outer circumferential side of the flat portion; and
a flange portion having an annular flat surface with a second width on the wall portion.

(6) The substrate processing apparatus of (5), wherein a bottom portion of the valve body is connected to the flange portion.

(7) The substrate processing apparatus of (6), wherein the valve body is electrically connected to the baffle plate with a conductive member interposed between the bottom portion and the flange portion.

(8) The substrate processing apparatus of any one of (5) to (7), wherein in the baffle plate, a connecting portion between an upper portion of the inclined portion of the end portion and an upper surface of the flat portion is formed as a curved surface.

(9) The substrate processing apparatus of any one of (1) to (8), wherein the contact member is disposed along a side surface of the substrate support.

(10) The substrate processing apparatus of any one of (1) to (9), wherein the contact member includes a core material in a deformation region of the elastic member.

(11) The substrate processing apparatus of (10), wherein the core material has a circular cross section in a radial direction of the substrate support.

(12) The substrate processing apparatus of (10), wherein the core material has a trapezoidal cross section in a radial direction of the substrate support.

(13) The substrate processing apparatus of (10), wherein the core material has a V-shaped cross section in a radial direction of the substrate support.

(14) The substrate processing apparatus of (10), wherein the core material has a bridge-shaped cross-section in a radial direction of the substrate support.

(15) The substrate processing apparatus of any one of (1) to (14), wherein the valve body includes a conductive member on a conductive surface formed at an upper end of the valve body and in contact with a conductive upper member disposed along an upper inner wall of the chamber, and
when the opening is closed by raising the valve body, the conductive surface is brought into contact with the upper member in a vertical direction, and the valve body and the upper member are electrically connected by the conductive member.

(16) The substrate processing apparatus of (15), further comprising:
an insulating member that insulates the upper member and a shower head disposed at a ceiling portion of the chamber.

(17) A shutter disposed at an opening of a cylindrical chamber of a substrate processing apparatus, comprising:
a valve body configured to open and close the opening of the chamber; and
a baffle plate disposed between an inner peripheral side of the chamber and a substrate support disposed in the chamber, and having a vertically inclined portion formed at an end portion on a substrate support side,
wherein in a state where the shutter is closed, contact between the end portion on the substrate support side and a contact member disposed on a side surface of the substrate support and formed of a conductive elastic member is maintained.

(18) The shutter of (17), wherein the contact member includes a core material in a deformation region of the elastic member.

The invention claimed is:

1. A substrate processing apparatus comprising:
a cylindrical chamber;
a deposition shield disposed in the cylindrical chamber;
a substrate support disposed in the chamber;
a shutter including:
a valve body configured to open and close an opening of the chamber, the valve body including an upper surface that is brought into contact with the deposition shield;
a baffle plate disposed between an inner peripheral side of the chamber and the substrate support, the baffle plate having a vertically inclined portion at an end portion on a substrate support side; and
a contact member disposed on a side surface of the substrate support and formed of a conductive elastic member,
wherein in a state where the shutter is closed, contact between the end portion on the substrate support side and the contact member is maintained and contact between the upper surface of the valve body and the deposition shield is maintained,
the valve body further includes a conductive member on a conductive surface formed on the upper surface of the valve body and in contact with the deposition shield, and
the substrate processing apparatus further includes an insulating member that insulates the deposition shield.

2. The substrate processing apparatus of claim 1, wherein the shutter has a cylindrical shape.

3. The substrate processing apparatus of claim 1, wherein the end portion on the substrate support side has a vertical length longer than a vertical length of the contact member.

4. The substrate processing apparatus of claim 1, wherein the inclined portion is formed such that a width of the baffle plate becomes narrower from a bottom surface side toward an upper surface side of the baffle plate.

5. The substrate processing apparatus of claim 1, wherein the baffle plate includes:
a flat portion having an annular flat surface with a first width and having the end portion on the substrate support side on an inner circumferential side;
a cylindrical wall portion serving as a vertical surface on an outer circumferential side of the flat portion; and
a flange portion having an annular flat surface with a second width on the wall portion, and
a bottom portion of the valve body is connected to the flange portion of the baffle plate.

6. The substrate processing apparatus of claim 5, wherein the valve body is electrically connected to the baffle plate with a conductive member interposed between the bottom portion and the flange portion.

7. The substrate processing apparatus of claim 5, wherein in the baffle plate, a connecting portion between an upper portion of the inclined portion of the end portion and an upper surface of the flat portion is formed as a curved surface.

8. The substrate processing apparatus of claim 1, wherein the contact member is disposed along a side surface of the substrate support.

9. The substrate processing apparatus of claim 1, wherein the contact member includes a core material in a deformation region of the elastic member.

10. The substrate processing apparatus of claim 9, wherein the core material has a circular cross section or a trapezoidal cross section in a radial direction of the substrate support.

11. The substrate processing apparatus of claim 9, wherein the core material has a V-shaped cross section in a radial direction of the substrate support.

12. The substrate processing apparatus of claim 9, wherein the core material has a bridge-shaped cross-section in a radial direction of the substrate support.

13. The substrate processing apparatus of claim 1,
wherein when the opening is closed by raising the valve body, the conductive surface is brought into contact with the deposition shield in a vertical direction, and the valve body and the deposition shield are electrically connected by the conductive member.

14. The substrate processing apparatus of claim 13, further comprising:
a shower head disposed at a ceiling portion of the chamber.

15. A shutter disposed at an opening of a cylindrical chamber of a substrate processing apparatus, comprising:
a valve body configured to open and close the opening of the chamber, the valve body including an upper surface that is configured to be brought into contact with a deposition shield disposed in the cylindrical chamber; and
a baffle plate disposed between an inner peripheral side of the chamber and a substrate support disposed in the chamber, and having a vertically inclined portion formed at an end portion on a substrate support side,
wherein in a state where the shutter is closed, contact between the end portion on the substrate support side and a contact member disposed on a side surface of the substrate support and formed of a conductive elastic member is maintained and contact between the upper surface of the valve body and the deposition shield is maintained,
the valve body includes a conductive member on a conductive surface formed on the upper surface of the valve body and in contact with the deposition shield, and
the deposition shield is configured to be disposed between an insulating member of the substrate processing apparatus and the valve body.

16. The shutter of claim 15, wherein the contact member includes a core material in a deformation region of the elastic member.

17. The substrate processing apparatus of claim 1, wherein the contact member is disposed in a groove formed in a shield member of the substrate support, the groove extending in a circumferential direction to accommodate the contact member.

18. The shutter of claim 15, wherein the baffle plate includes:
a flat portion having an annular flat surface with a first width and having the end portion on the substrate support side on an inner circumferential side;
a cylindrical wall portion serving as a vertical surface on an outer circumferential side of the flat portion; and
a flange portion having an annular flat surface with a second width on the wall portion, and
a bottom portion of the valve body is connected to the flange portion of the baffle plate.

19. The substrate processing apparatus of claim 1, wherein the cylindrical chamber includes a sidewall, and
the deposition shield is disposed between the sidewall and the insulating member.

* * * * *